(12) United States Patent
Yoshii

(10) Patent No.: US 12,100,612 B2
(45) Date of Patent: Sep. 24, 2024

(54) PLATE-SHAPED WORKPIECE HOLDING TOOL

(71) Applicant: DISCO CORPORATION, Tokyo (JP)

(72) Inventor: Shungo Yoshii, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 861 days.

(21) Appl. No.: 17/109,907

(22) Filed: Dec. 2, 2020

(65) Prior Publication Data

US 2021/0175113 A1    Jun. 10, 2021

(30) Foreign Application Priority Data

Dec. 6, 2019   (JP) ................................ 2019-220939

(51) Int. Cl.
*H01L 21/683*   (2006.01)
*B25J 15/06*   (2006.01)

(52) U.S. Cl.
CPC ...... *H01L 21/6838* (2013.01); *B25J 15/0683* (2013.01)

(58) Field of Classification Search
CPC ... H01L 21/6838; B25J 15/0683; C25D 17/06
See application file for complete search history.

(56) References Cited

U.S. PATENT DOCUMENTS

| | | | | |
|---|---|---|---|---|
| 5,096,536 A | * | 3/1992 | Cathey, Jr. | ........ H01L 21/67069 118/724 |
| 6,466,046 B1 | * | 10/2002 | Maruyama | .......... H01L 21/6838 324/762.05 |
| 6,746,318 B2 | * | 6/2004 | Mallery | .............. H01L 21/6838 451/388 |
| 10,672,631 B2 | * | 6/2020 | Mao | ......................... H01L 25/50 |
| 11,587,818 B2 | * | 2/2023 | Yu | .......................... B25B 11/005 |
| 2017/0317225 A1 | * | 11/2017 | Yonehara | ............ H01L 21/6838 |
| 2019/0385890 A1 | * | 12/2019 | Breingan | .......... H01L 21/67742 |

FOREIGN PATENT DOCUMENTS

| | | |
|---|---|---|
| CN | 101064268 A | 10/2007 |
| CN | 108296935 A | 7/2018 |
| DE | 4116392 A1 * | 11/1992 |

(Continued)

OTHER PUBLICATIONS

Search Report issued by the Chinese Patent Office in corresponding CN Patent Application No. 202011398218.9 dated Jul. 7, 2023.

(Continued)

*Primary Examiner* — Eric A. Gates
(74) *Attorney, Agent, or Firm* — GREER BURNS & CRAIN, LTD.

(57) ABSTRACT

A plate-shaped workpiece holding tool includes a holding base having a joint port coupled to a suction source and a holding surface for holding the plate-shaped workpiece thereon, a first O-ring disposed on the holding surface, a second O-ring disposed on the holding surface radially inwardly of the first O-ring, a suction port that is open in the holding surface between the first O-ring and the second O-ring and held in fluid communication with the joint port, and a liquid supply mechanism for forming a liquid seal between the holding surface and the plate-shaped workpiece radially outwardly of the first O-ring.

13 Claims, 3 Drawing Sheets

(56) References Cited

FOREIGN PATENT DOCUMENTS

JP 2000094221 A 4/2000
JP 2016111143 A 6/2016

OTHER PUBLICATIONS

Fist Office Action issued by the Chinese Patent Office in corresponding CN Patent Application No. 202011398218.9dated Jul. 7, 2023.
Second Office Action issued by the Chinese Patent Office in corresponding CN Patent Application No. 202011398218.9dated Jan. 5, 2024.

\* cited by examiner

PLATE-SHAPED WORKPIECE HOLDING TOOL

BACKGROUND OF THE INVENTION

Field of the Invention

The present invention relates to a plate-shaped workpiece holding tool for holding a plate-shaped workpiece such as a wafer under suction.

Description of the Related Art

Wafers having a plurality of devices such as integrated circuits (ICs) and large-scale integrated (LSI) circuits formed in respective areas on a face side that are demarcated by a plurality of projected dicing lines are divided into individual device chips by a dicing apparatus or a laser processing apparatus, and the divided device chips will be each used in electric equipment such as a mobile phone or a personal computer.

Wafers on which devices are to be formed are produced by slicing an ingot such as a silicon ingot or a silicon carbide (SiC) ingot with a wire saw or a laser processing apparatus. Wafers sliced from an ingot have face and reverse sides ground and polished to a mirror finish (see, for example, JP 2000-94221A and JP 2016-111143A).

SUMMARY OF THE INVENTION

However, even the sliced wafers sliced from an ingot still have surface irregularities and undulations. When such a wafer is delivered by a holding tool having a holding surface that holds the wafer under suction thereon, gaps are likely to be formed between the wafer and the holding surface, introducing ambient air therethrough between the wafer and the holding surface. As a result, the wafer tends to drop off from the holding surface of the holding tool.

It is therefore an object of the present invention to provide a plate-shaped workpiece holding tool that is capable of reliably holding under suction a plate-shaped workpiece such as a wafer having surface irregularities and undulations.

In accordance with an aspect of the present invention, there is provided a plate-shaped workpiece holding tool for holding a plate-shaped workpiece under suction, including a holding base having a joint port coupled to a suction source and a holding surface for holding the plate-shaped workpiece thereon, a first O-ring disposed on the holding surface, a second O-ring disposed on the holding surface radially inwardly of the first O-ring, a suction port that is open in the holding surface between the first O-ring and the second O-ring and held in fluid communication with the joint port, and a liquid supply mechanism for forming a liquid seal between the holding surface and the plate-shaped workpiece radially outwardly of the first O-ring.

According to the present invention, even in a case where spaces are created between the first and second O-rings and an upper surface of the plate-shaped workpiece, such as a wafer, since the liquid seal is present radially outwardly of the first O-ring, ambient air is prevented from flowing in through the spaces between the first and second O-rings and the plate-shaped workpiece. Therefore, the workpiece can reliably be held under suction on the holding base even if the plate-shaped workpiece has surface irregularities and undulations.

The above and other objects, features and advantages of the present invention and the manner of realizing them will become more apparent, and the invention itself will best be understood from a study of the following description and an appended claim with reference to the attached drawings showing a preferred embodiment of the invention.

DETAILED DESCRIPTION OF THE PREFERRED EMBODIMENT

Figure 1:
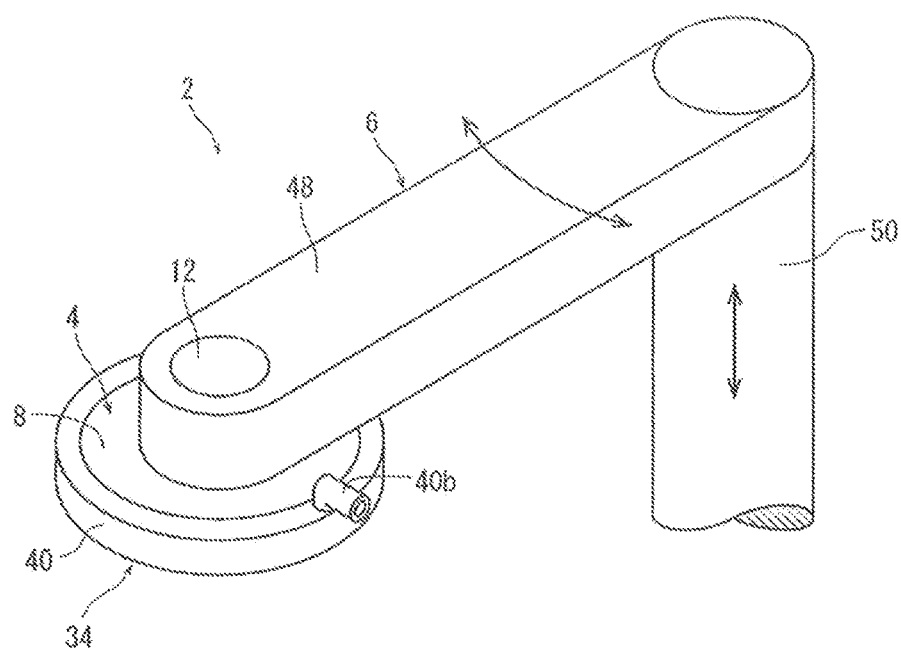
FIG. 1 is a perspective view of a plate-shaped workpiece holding tool according to an embodiment of the present invention.
Figure 2:
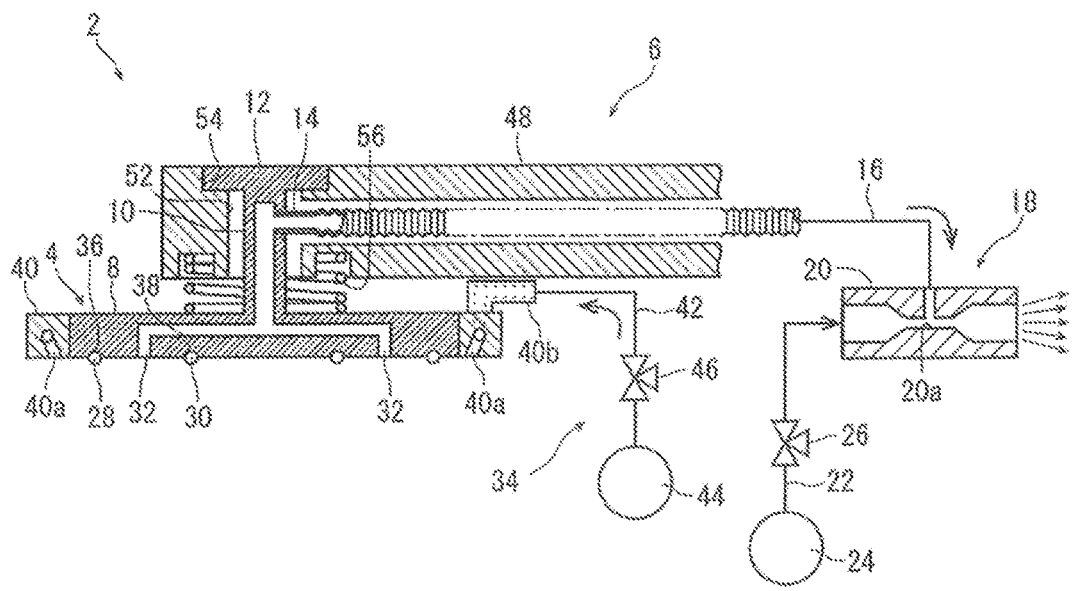
FIG. 2 is a cross-sectional view of the plate-shaped workpiece holding tool illustrated in FIG. 1.

A plate-shaped workpiece holding tool according to a preferred embodiment of the present invention will hereinafter be described below with reference to the drawings. As illustrated in FIGS. 1 and 2, the plate-shaped workpiece holding tool, denoted by 2, includes a holding base 4 having a joint port coupled to a suction source and a holding surface for holding a plate-shaped workpiece thereon, and a moving mechanism 6 for moving the holding base 4. As illustrated in FIG. 2, the holding base 4 includes a main body 8 shaped as a circular plate, a hollow cylindrical portion 10 extending upwardly from a central area of an upper surface of the main body 8, and a circular retainer 12 fixed to an upper end of the hollow cylindrical portion 10 and larger in diameter than the hollow cylindrical portion 10. The hollow cylindrical joint port, denoted by 14, is attached to the hollow cylindrical portion 10 and extends radially outwardly therefrom. The joint port 14 is coupled to the suction source, denoted by 18, through a fluid channel 16.

As illustrated in FIG. 2, the suction source 18 according to the present embodiment includes an ejector 20 shaped as a hollow cylinder as a whole, an air supply source 24 coupled to the ejector 20 through a fluid channel 22, for supplying air to the ejector 20, and a valve 26 for selectively opening and closing the fluid channel 22. The ejector 20 includes a smaller-diameter portion 20a disposed in an axially intermediate portion thereof and smaller in inside diameter than the rest of the ejector 20. The smaller-diameter portion 20a is connected to the fluid channel 16 extending to the joint port 14 of the holding base 4. The ejector 20 has an axial end connected to the fluid channel 22 that extends to the air supply source 24.

The suction source 18 operates as follows: When the air supply source 24 is actuated with the fluid channel 22 being opened by opening the valve 26, the air supply source 24 supplies high-pressure air through the fluid channel 22 to the ejector 20, developing a negative pressure in the smaller-diameter portion 20a to draw in air from the fluid channel 16. The suction source 18 may include a suction pump. However, since the suction source 18 may draw in a liquid from a liquid supply mechanism 34 to be described later in some cases, the suction source 18 should preferably be of a configuration including the above-described ejector 20 that discharges the high-pressure air and the liquid from the other axial end of the ejector 20.

Figure 3:
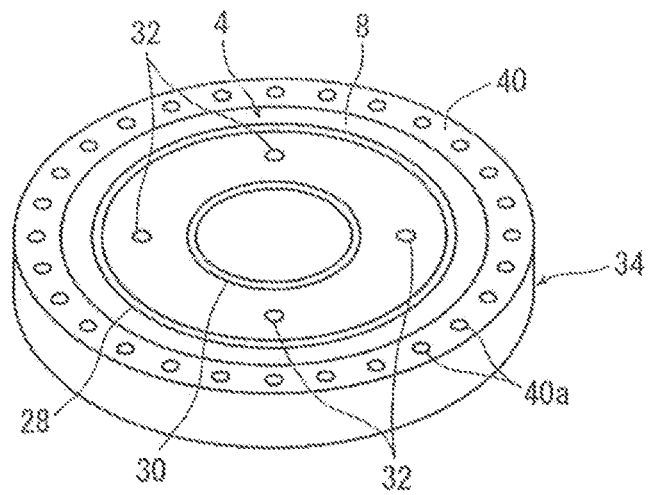
FIG. 3 is a perspective view of a holding base of the plate-shaped workpiece holding tool illustrated in FIG. 1, the holding base being turned upside down to have its lower surface facing upwardly.

As illustrated in FIGS. 2 and 3, the plate-shaped workpiece holding tool 2 further includes a first O-ring 28 disposed on a lower surface of the main body 8 that acts as the holding surface, a second O-ring 30 disposed on the lower surface of the main body 8 and positioned radially inwardly of the first O-ring 28, a plurality of suction holes 32 that are open in the lower surface of the main body 8 radially between the first O-ring 28 and the second O-ring 30 and held in fluid communication with the joint port 14 via fluid channels defined in the main body 8 and the hollow cylindrical portion 10, and the liquid supply mechanism, denoted by 34, for forming a liquid seal between a portion of the holding surface that extends radially outwardly of the first O-ring 28 and a plate-shaped workpiece held on the holding surface of the holding base 4.

Each of the first O-ring 28 and the second O-ring 30 is suitably made of an elastically deformable material such as synthetic rubber. The diameter of the second O-ring 30 is smaller than the diameter of the first O-ring 28. As illustrated in FIG. 2, the lower surface of the main body 8 has a first annular groove 36 defined therein and a second annular groove 38 defined therein radially inwardly of the first annular groove 36 and smaller in diameter than the first annular groove 36. The first O-ring 28 is fitted in the first annular groove 36, and the second O-ring 30 is fitted in the second annular groove 38.

As illustrated in FIGS. 2 and 3, the plurality of suction holes 32, specifically four suction holes 32 according to the present embodiment, that are open in the lower surface of the main body 8 are positioned at spaced intervals in circumferential directions of the main body 8 between the first O-ring 28 and the second O-ring 30. As can be understood from FIG. 2, the suction holes 32 are held in fluid communication with the fluid channels defined in the main body 8 and the hollow cylindrical portion 10 and also with the joint port 14.

When the suction source 18 is actuated, it produces and transmits suction forces via the fluid channel 16, the joint port 14, and the fluid channels defined in the main body 8 and the hollow cylindrical portion 10 to the suction holes 32, holding under suction a plate-shaped workpiece such as a wafer on the lower surface of the main body 8. Thus, the lower surface of the main body 8 of the holding base 4 acts as the holding surface for holding the plate-shaped workpiece under suction thereon. When the plate-shaped workpiece is held under suction on the lower surface of the main body 8, the first O-ring 28 and the second O-ring 30 have respective lower ends held in contact with an upper surface of the plate-shaped workpiece, creating gaps between the lower surface of the main body 8 and the upper surface of the plate-shaped workpiece, as illustrated in FIG. 4.

As illustrated in FIGS. 2 and 3, the liquid supply mechanism 34 includes an annular member 40 fixed to an outer circumferential surface of the main body 8 of the holding base 4. The annular member 40 has a plurality of ejection holes 40a defined therein that are open in a lower surface thereof at circumferentially spaced intervals and a supply port 40b (see FIGS. 1 and 2) held in fluid communication with the ejection holes 40a. As illustrated in FIG. 2, the liquid supply mechanism 34 further includes a liquid supply source 44 coupled to the supply port 40b via a fluid channel 42 and a valve 46 for selectively opening and closing the fluid channel 42.

Figure 4:
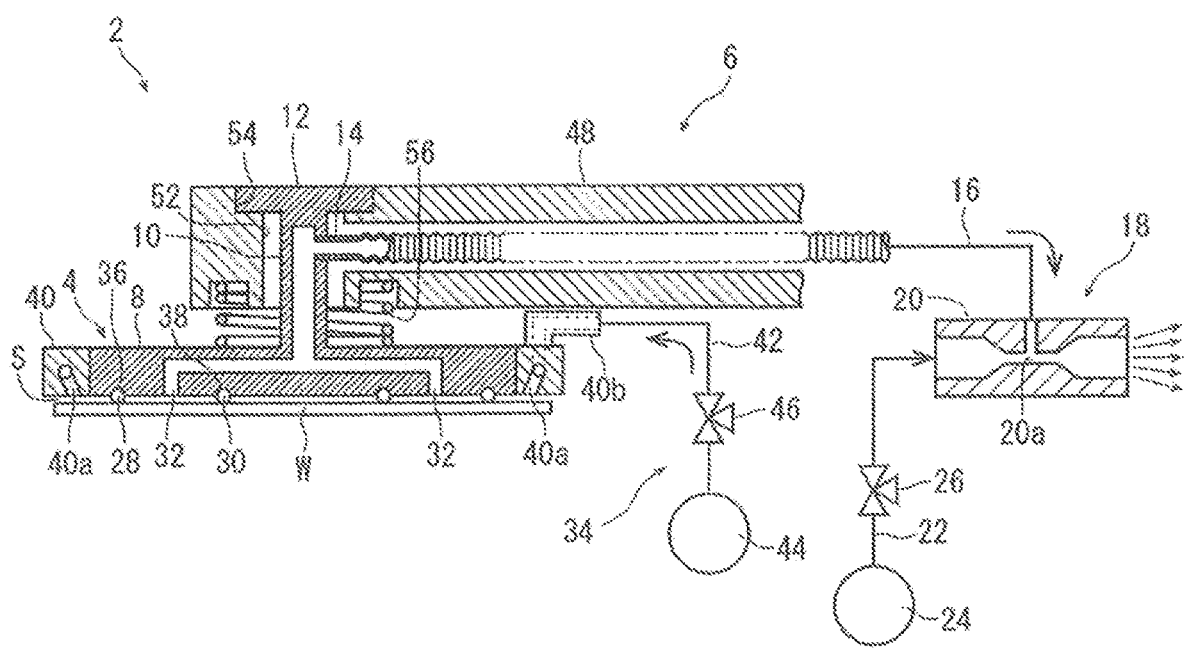
FIG. 4 is a cross-sectional view illustrating a manner in which the plate-shaped workpiece holding tool illustrated in FIG. 1 is holding a plate-shaped workpiece.

As illustrated in FIG. 4, when the fluid channel 42 is opened by the valve 46 while the plate-shaped workpiece is being held under suction on the lower surface, i.e., the holding surface, of the main body 8 of the holding base 4, the liquid supply source 44 supplies a liquid, such as water, through the fluid channel 42 to the supply port 40b, from which the liquid is ejected out of the ejection holes 40a, forming an annular liquid seal S between the lower surface, i.e., the holding surface, of the main body 8 of the holding base 4 and the upper surface of the plate-shaped workpiece such as a wafer W radially outwardly of the first O-ring 28. With the plate-shaped workpiece holding tool 2 according to the present embodiment, the main body 8 of the holding base 4 and the annular member 40 of the liquid supply mechanism 34 are configured as separate members. However, the main body 8 and the annular member 40 may be configured as a single common member.

The moving mechanism 6 will be described below with reference to FIGS. 1 and 2. As illustrated in FIG. 1, the moving mechanism 6 includes an arm 48 extending essentially horizontally from an end thereof that is coupled to the holding base 4, a rotational shaft 50 fixed to the other end of the arm 48 and extending vertically, an electric motor, not shown, for rotating the rotational shaft 50 about its vertical central axis, and lifting and lowering means, not shown, such as an electrically operated cylinder for lifting and lowering the rotational shaft 50.

As illustrated in FIG. 2, the arm 48 has a vertically extending through opening 52 defined in the end thereof, and the hollow cylindrical portion 10 of the holding base 4 is inserted in the through opening 52. The arm 48 also has a recess 54 defined in an upper portion of the end of the arm 48 circumferentially around an upper end of the through opening 52, the recess 54 being larger in diameter than the through opening 52. The retainer 12 of the holding base 4 is fitted in the recess 54, preventing the holding base 4 from being dislodged from the arm 48.

As can be understood from FIG. 2, a helical spring 56 is disposed between a lower surface of the end of the arm 48 and an upper surface of the main body 8 of the holding base 4. When the lower surface of the holding base 4 is positioned on the upper surface of the plate-shaped workpiece, the holding base 4 is lifted, compressing the helical spring 56. The helical spring 56 as it is compressed dampens shocks applied from the lower surface of the holding base 4 to the plate-shaped workpiece and allows the lower surface of the holding base 4 and the attracted surface of the plate-shaped workpiece such as the wafer W to fit each other better.

A process of delivering the plate-shaped workpiece, as the wafer W shaped as a circular plate, using the plate-shaped workpiece holding tool 2 as described above will be described below with reference to FIG. 4.

According to the process of delivering the wafer W using the plate-shaped workpiece holding tool 2, the rotational shaft 50 is appropriately rotated about its central axis by the electric motor and appropriately lifted or lowered by the lifting and lowering means to position the lower surface, i.e., the holding surface, of the main body 8 of the holding base 4 above the wafer W that is placed on an appropriate table, not shown. Then, the rotational shaft 50 is lowered by the lifting and lowering means to bring the first and second O-rings 28 and 30 of the holding base 4 into intimate contact with an upper surface of the wafer W.

Then, while the fluid channel 22 is being opened by the valve 26, the air supply source 24 is actuated to enable the ejector 20 to develop suction forces in the suction holes 32 in the holding base 4, holding the upper surface of the wafer W under suction on the lower surface of the main body 8 of the holding base 4. Then, as illustrated in FIG. 4, the fluid channel 42 is opened by the valve 46 to eject the liquid such as water from the liquid supply source 44 out of the ejection holes 40a, forming the liquid seal S between the lower surface of the main body 8 and the upper surface of the wafer W radially outwardly of the first O-ring 28.

Thereafter, the rotational shaft 50 is rotated about its central axis by the electric motor and appropriately lifted or lowered by the lifting and lowering means to deliver the wafer W held on the holding base 4 to bring the lower surface of the wafer W into contact with an upper surface of an appropriate table, not shown, on which the wafer W is to be placed. Then, the suction source 18 is inactivated to release the wafer W from the holding base 4, whereupon the wafer W is placed onto the upper surface of the table. In this manner, the wafer W is delivered by the plate-shaped workpiece holding tool 2.

With the plate-shaped workpiece holding tool 2 according to the present embodiment, even in a case where spaces are created between the lower ends of the first and second O-rings 28 and 30 and the upper surface of the wafer W, since the liquid seal S is present radially outwardly of the first O-ring 28, ambient air is prevented from flowing in through the spaces between the first and second O-rings 28 and 30 and the wafer W. Therefore, the wafer W can reliably be held under suction on the holding base 4 even if the wafer W has surface irregularities and undulations.

Figure 5:
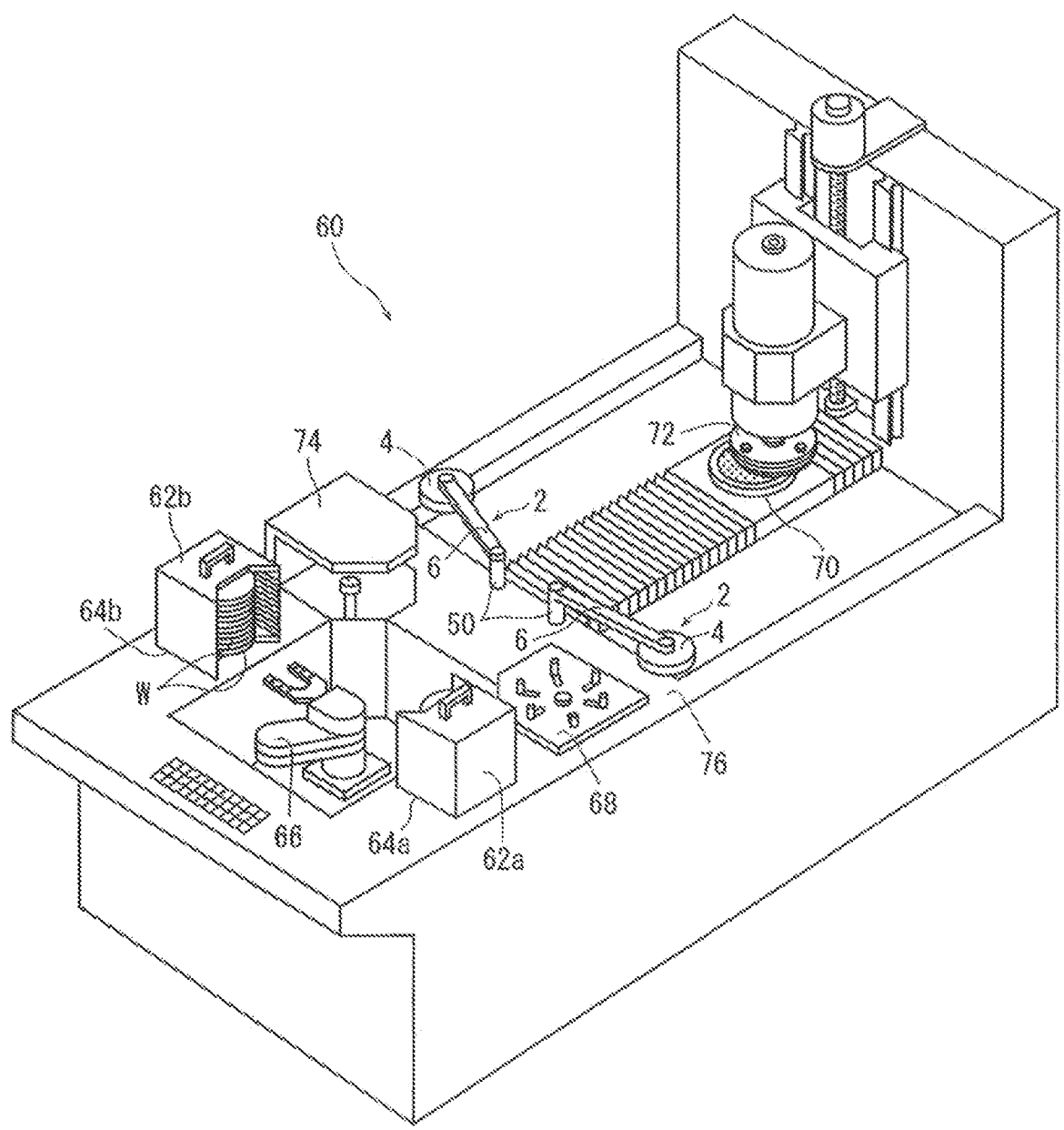
FIG. 5 is a perspective view of a grinding apparatus that incorporates the plate-shaped workpiece holding tool illustrated in FIG. 1.

The plate-shaped workpiece holding tool 2 may be mounted on a grinding apparatus 60 illustrated in FIG. 5. The grinding apparatus 60 includes a first cassette rest area 64a for placing thereon a first cassettes 62a housing a plurality of wafers W to be ground, a second cassette rest area 64b for placing thereon a second cassettes 62b housing the plurality of wafers W that have been ground, unloading and loading means 66 for unloading a wafer W to be ground from the first cassette 62a and loading a wafer W that has been ground into the second cassette 62b, temporary rest means 68 for temporarily placing thereon the wafer W to be ground that has been unloaded from the first cassette 62a by the unloading and loading means 66, first delivery means for delivering the wafer W to be ground that has been temporarily placed on the temporary rest means 68 to a chuck table 70, grinding means 72 for grinding an upper surface of the wafer W held on the chuck table 70, and second delivery means for delivering the wafer W that has been ground from the chuck table 70 to cleaning means 74. Each of the first delivery means and the second delivery means referred to above may include the plate-shaped workpiece holding tool 2 described above.

In the grinding apparatus 60 illustrated in FIG. 5, the rotational shaft 50 of the moving mechanism 6 of the plate-shaped workpiece holding tool 2 is rotatably mounted on a base 76 of the grinding apparatus 60. The wafer W that is delivered by the first delivery means may have surface irregularities and undulations because the wafer W is yet to be ground by the grinding means 72. Since the plate-shaped workpiece holding tool 2 is capable of reliably holding under suction even the wafer W with surface irregularities and undulations, as described above, the wafer W is prevented from dropping off the plate-shaped workpiece holding tool 2 while being delivered thereby.

The present invention is not limited to the details of the above described preferred embodiment. The scope of the invention is defined by the appended claim and all changes and modifications as fall within the equivalence of the scope of the claim are therefore to be embraced by the invention.

What is claimed is:

1. A plate-shaped workpiece holding tool for holding a plate-shaped workpiece under suction, comprising:
   a holding base having a joint port coupled to a suction source and a holding surface for holding the plate-shaped workpiece thereon;
   a moving mechanism, including an arm coupled to the holding base, wherein the moving mechanism is configured and arranged for moving the holding base;
   a first O-ring disposed on the holding surface;
   a second O-ring disposed on the holding surface radially inwardly of the first O-ring;
   a suction port that is open in the holding surface between the first O-ring and the second O-ring and held in fluid communication with the joint port; and
   a liquid supply mechanism for forming a liquid seal between the holding surface and the plate-shaped workpiece radially outwardly of the first O-ring.

2. The plate-shaped workpiece holding tool according to claim 1, wherein the arm extends in a generally horizontal direction and includes a vertically extending opening that is configured and arranged to receive a cylindrical portion of the holding base.

3. The plate-shaped workpiece holding tool according to claim 2, wherein the moving mechanism additionally comprises a rotational shaft that extends in a vertical direction, and further wherein an upper end of the rotational shaft is coupled to the arm.

4. The plate-shaped workpiece holding tool according to claim 1, wherein the moving mechanism additionally comprises a rotational shaft that is coupled to the arm.

5. The plate-shaped workpiece holding tool according to claim 1, wherein the liquid supply mechanism includes a plurality of ejection holes, and further wherein the ejection holes are each positioned in an area that is radially outward of the first O-ring and radially inward of an outer periphery of the plate-shaped workpiece.

6. The plate-shaped workpiece holding tool according to claim 1, wherein the holding surface faces downwardly and is configured and arranged to face an upper surface of the plate-shaped workpiece.

7. The plate-shaped workpiece holding tool according to claim 1, wherein the suction source includes an ejector shaped as a hollow cylinder and an air supply source for supplying air to the ejector, the ejector having a first end, a second end opposite the first end and a smaller diameter portion arranged between the first end and the second end, the smaller diameter portion being connected to the joint port of the holding base, the ejector being configured to discharge a mixture of high pressure air from the air supply source and liquid from the joint port of the holding base through the second end.

8. A plate-shaped workpiece holding tool for holding a plate-shaped workpiece under suction, comprising:
   a holding base having a joint port coupled to a suction source and a holding surface for holding the plate-shaped workpiece thereon, wherein the holding surface faces downwardly and is configured and arranged to face an upper surface of the plate-shaped workpiece;
   a first O-ring disposed on the holding surface;
   a second O-ring disposed on the holding surface radially inwardly of the first O-ring;

a suction port that is open in the holding surface between the first O-ring and the second O-ring and held in fluid communication with the joint port; and a liquid supply mechanism for forming a liquid seal between the holding surface and the plate-shaped workpiece radially outwardly of the first O-ring.

9. The plate-shaped workpiece holding tool according to claim 8, wherein the liquid supply mechanism includes a plurality of ejection holes, and further wherein the ejection holes are each positioned in an area that is radially outward of the first O-ring and radially inward of an outer periphery of the plate-shaped workpiece.

10. A plate-shaped workpiece holding tool for holding a plate-shaped workpiece under suction, comprising:

a holding base having a joint port coupled to a suction source and a holding surface for holding the plate-shaped workpiece thereon;

a moving mechanism configured and arranged for moving the holding base such that the plate-shaped workpiece can be moved between a first position and a second position on a processing apparatus;

a first O-ring disposed on the holding surface;

a second O-ring disposed on the holding surface radially inwardly of the first O-ring;

a suction port that is open in the holding surface between the first O-ring and the second O-ring and held in fluid communication with the joint port; and a liquid supply mechanism for forming a liquid seal between the holding surface and the plate-shaped workpiece radially outwardly of the first O-ring.

11. The plate-shaped workpiece holding tool according to claim 10, wherein the liquid supply mechanism includes a plurality of ejection holes, and further wherein the ejection holes are each positioned in an area that is radially outward of the first O-ring and radially inward of an outer periphery of the plate-shaped workpiece.

12. The plate-shaped workpiece holding tool according to claim 10, wherein the holding surface faces downwardly and is configured and arranged to face an upper surface of the plate-shaped workpiece.

13. The plate-shaped workpiece holding tool according to claim 10, wherein the processing apparatus comprises a grinding apparatus.

* * * * *